(12) United States Patent
Sato

(10) Patent No.: US 10,303,050 B2
(45) Date of Patent: May 28, 2019

(54) IMPRINT APPARATUS, IMPRINT METHOD, DETECTING METHOD, AND METHOD OF MANUFACTURING DEVICE

(71) Applicant: CANON KABUSHIKI KAISHA, Tokyo (JP)

(72) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/003,723

(22) Filed: Jun. 8, 2018

(65) Prior Publication Data

US 2018/0292748 A1 Oct. 11, 2018

Related U.S. Application Data

(62) Division of application No. 14/482,426, filed on Sep. 10, 2014, now Pat. No. 10,042,249.

(30) Foreign Application Priority Data

Sep. 13, 2013 (JP) .................. 2013-190477

(51) Int. Cl.
G01J 9/02 (2006.01)
G03F 7/00 (2006.01)
G03F 9/00 (2006.01)

(52) U.S. Cl.
CPC .......... *G03F 7/0002* (2013.01); *G03F 9/7042* (2013.01); *G03F 9/7049* (2013.01); *G03F 9/7065* (2013.01); *G01J 2009/0234* (2013.01)

(58) Field of Classification Search
None
See application file for complete search history.

(56) References Cited

U.S. PATENT DOCUMENTS

2002/0098426 A1\* 7/2002 Sreenivasan ........ B29C 35/0888 430/22
2006/0032437 A1\* 2/2006 McMackin ........... G03F 7/0002 118/100
2009/0140445 A1\* 6/2009 Lu ......................... B29C 43/003 264/40.1

(Continued)

FOREIGN PATENT DOCUMENTS

JP 2003316016 A * 11/2003
JP 2004335910 A * 11/2004 ............... G03F 1/22
JP 2006514428 W * 4/2006

(Continued)

*Primary Examiner* — Benjamin A Schiffman

(74) *Attorney, Agent, or Firm* — Canon U.S.A., Inc. IP Division

(57) ABSTRACT

This disclosure provides an imprint apparatus configured to form a pattern with an imprint material by bringing the imprint material on a substrate and a pattern of the mold into contact with each other including a drive unit to bring part of the pattern of the mold into contact with the imprint material, and bring the pattern into contact with the imprint material so a contact surface area between the pattern of the mold and the imprint material increases, an interference fringe detecting unit to detect an interference fringe generated by reflected light from the pattern of the mold and reflected light from the substrate, and a state detecting unit to detect a contact state between the pattern of the mold and the imprint material on the basis of the interference fringe.

27 Claims, 9 Drawing Sheets

(56) References Cited

U.S. PATENT DOCUMENTS

2011/0206852 A1* 8/2011 Shiode .................. B82Y 10/00
427/356
2013/0056905 A1* 3/2013 Hamaya ................ G03F 7/0002
264/293

FOREIGN PATENT DOCUMENTS

| | | | | | |
|---|---|---|---|---|---|
| JP | 2006514428 | A | * | 4/2008 | |
| JP | 2009536591 | W | * | 10/2009 | |
| JP | 2011512019 | W | * | 4/2011 | |
| JP | 2012253325 | A | * | 12/2012 | ............. G01B 11/27 |
| JP | 2013038365 | A | * | 2/2013 | ........... G03F 7/0002 |
| TW | 337255 | U1 | * | 7/1998 | |
| TW | 407263 | A | * | 10/2000 | |
| TW | 337255 | U | * | 8/2008 | |
| TW | 337255 | B1 | * | 2/2011 | |
| TW | 407263 | U | * | 11/2011 | |
| TW | 201139118 | A | * | 11/2011 | |
| TW | 201319552 | A | * | 5/2013 | |
| TW | 407263 | B1 | * | 9/2013 | |

\* cited by examiner

IMPRINT APPARATUS, IMPRINT METHOD, DETECTING METHOD, AND METHOD OF MANUFACTURING DEVICE

CROSS-REFERENCE TO RELATED APPLICATIONS

This application is a divisional application of U.S. application Ser. No. 14/482426 filed on Sep. 10, 2014, which claims the benefit of Japanese Patent Application No. 2013-190477 filed Sep. 13, 2013, all of which are hereby incorporated by reference herein in their entirety.

BACKGROUND

Field of the Invention

This disclosure relates to an imprint apparatus configured to detect a contact state between a mold used for imprinting and an imprint material supplied onto a substrate, an imprint method, and a device manufacturing method.

Description of the Related Art

An imprint technique is a technique for transferring a pattern formed on a mold to an imprint material supplied onto a substrate, and is proposed as one of lithography techniques for manufacturing semiconductor devices or magnetic storage medium. An imprint apparatus is configured to bring an imprint material (for example, a photo-curing resin) on a substrate and a mold into contact with each other and let the imprint material to cure in a contact state. The distance between the cured imprint material and the mold is increased and the mold is separated from the imprint material, so that the mold pattern is transferred to the imprint material on the substrate.

Air bubbles may remain in a concave of the mold pattern coming into contact with the imprint material. If the imprint material is cured with the air bubbles remaining in the concave, the imprint material is molded into a shape different from the shape of the concave. Therefore, a desired pattern is not formed on the substrate. Therefore, in order to facilitate filling of the imprint material into the concave of the pattern, a method of curving (deforming) a pattern surface of the mold so as to project toward the substrate and bringing the curved projection into contact with the imprint material is known (PCT Japanese Translation Patent Publication No. 2009-536591). By bringing the mold pattern into contact with the imprint material from a center portion of the pattern toward the outside, the imprint material may be filled easily in the concave of the pattern of the mold and probability of remaining of air bubbles may be reduced.

It is known that a contact state when the mold and the imprint material (or the substrate) come into contact with each other has an impact on the result of pattern transfer. The contact state includes posture (inclination) of the mold, and presence or absence of dust between the mold and the substrate. The mold and the imprint material preferably come into contact with each other so that a contact portion between the mold and the imprint material spreads out from a center toward a peripheral portion of the pattern in a concentric fashion. Therefore, a technique of observing the contact state between the mold and the imprint material is required. PCT Japanese translation Patent Publication No. 2006-514428 proposes a method of figuring out a contact state between a mold and the imprint material by observing how a plurality of individual liquid droplets (beads) supplied onto the substrate spread when the mold and imprint material come into contact with each other.

Many imprint materials used in the imprint technique have low viscosities. The liquid droplets of the imprint material supplied on the substrate spread over the substrate and join each other, so that a layer of the imprint material is formed on the substrate. Therefore, actually, how the individual liquid droplets of the imprint material spread over cannot be detected when the mold and the imprint material come into contact with each other.

SUMMARY

This disclosure provides an imprint apparatus configured to form a pattern with an imprint material by bringing the imprint material on a substrate and a pattern of the mold into contact with each other including: a drive unit configured to bring part of the pattern of the mold into contact with the imprint material, and then bring the pattern into contact with the imprint material so that a contact surface area between the pattern of the mold and the imprint material increases; an interference fringe detecting unit configured to detect an interference fringe generated by reflected light from the pattern of the mold and reflected light from the substrate and changing as the contact surface area between the pattern of the mold and the imprint material increases; and a state detecting unit configured to detect a contact state between the pattern of the mold and the imprint material on the basis of the interference fringe.

Further features of the present invention will become apparent from the following description of exemplary embodiments with reference to the attached drawings.

DESCRIPTION OF THE EMBODIMENTS

Figure 1:
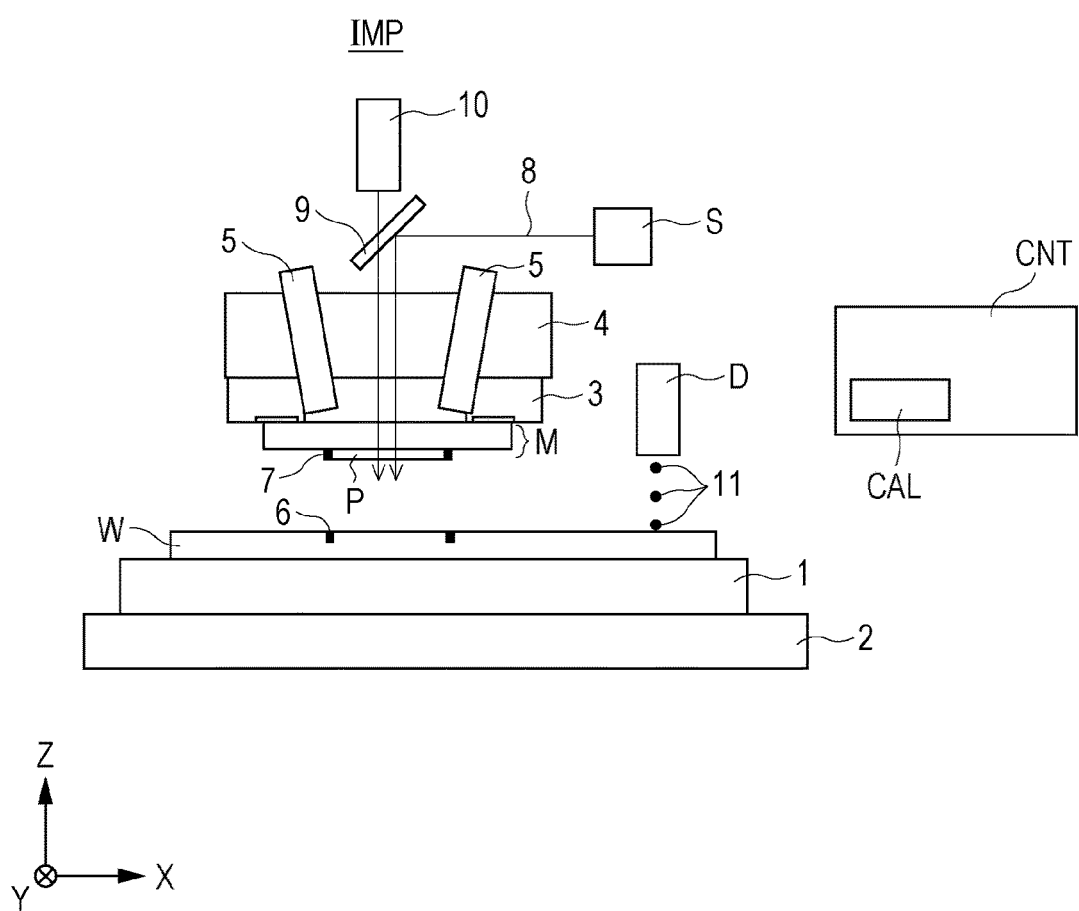
FIG. 1 is a drawing illustrating an imprint apparatus of a first embodiment.

Embodiments of this disclosure will be described below with reference to the attached drawings in detail. In the respective drawings, the same members are denoted by the same reference numerals and overlapped description is omitted.

First Embodiment

FIG. 1 illustrates an imprint apparatus IMP of a first embodiment. The imprint apparatus IMP of the first embodiment includes a substrate chuck 1 (substrate holding portion) configured to hold a substrate W, and a mold chuck 3 (die retaining unit) configured to hold a mold M. The imprint apparatus IMP further includes a mold stage 4 (mold drive unit) configured to support and move the mold chuck 3, and an alignment scope 5 fixed to the mold stage 4 and configured to detect an alignment mark formed on the substrate W (substrate-side mark 6) and an alignment mark formed on the mold M (mold-side mark 7). The imprint apparatus IMP further includes a substrate stage 2 configured to support and move the substrate chuck 1, and a control unit CNT configured to control an imprint action.

The alignment scope 5 detects the substrate-side mark 6 formed in a shot area on the substrate W and the mold-side mark 7 formed on a pattern P of the mold M. A calculating unit CAL of the control unit CNT (state detecting unit) obtains a relative positional deviation between the mold M and the substrate W from results of detection of the substrate-side mark 6 and the mold-side mark 7 detected by the alignment scope 5. The control unit CNT drives the substrate stage 2 and the mold stage 4 on the basis of the result of the obtained relative positional deviation and corrects the relative positional deviation between the mold M and the substrate W. The relative positional deviation is not limited to a shift component, and includes errors of magnification and rotational component. A shape of the pattern P (pattern area) of the mold M may be corrected so as to match the shot area formed on the substrate W. As a method of detecting the substrate-side mark 6 and the mold-side mark 7, a moiré signal that reflects a relative position between two marks may be used. The relative position of two marks may be obtained by detecting respective images of the marks.

The imprint apparatus IMP is provided with a supply unit D (dispenser) configured to supply an imprint material 11 onto the substrate W. In the first embodiment, a case where a UV-cured resin that is cured by being irradiated with a UV-ray is used as the imprint material 11 will be described. In a case where the substrate W to which the imprint material 11 is supplied with an external apparatus different from the imprint apparatus IMP is loaded to perform imprinting, the supply unit D needs not to be provided in the imprint apparatus IMP.

The imprint apparatus IMP further includes a mirror 9, a light source S configured to radiate exposure light (UV-ray) 8, and a detecting unit 10 configured to observe the shot area (pattern P) by using detection light (for example, visible light) having a wavelength different from the exposure light. The mirror 9 is a dichroic mirror, and includes a property to reflect the exposure light 8 and allow the detection light to pass therethrough. The exposure light 8 from the light source S is reflected by the mirror 9, and radiates the imprint material 11. The detection light (visible light) from the detecting unit 10 (interference fringe detecting unit) passes through the mirror 9, the mold stage 4, and the mold chuck 3, and illuminates the shot area on the substrate W. The visible light which illuminates the shot area is reflected by a surface of the substrate W and a surface of the pattern of a mold M, and is detected by the detecting unit 10 as a detection light (interfering light) including the reflected light from the substrate W and the reflected light from the mold M overlapped with each other. The detection light is detected by the detecting unit 10 as an interference fringe. The imprint apparatus IMP observes a contact state between the mold M and the imprint material 11 by using the detected interference fringe. The amount of liquid droplets of the imprint material to be supplied onto the substrate is several picoliters and the diameter of the liquid droplet is several micrometers. In order to detect how the individual liquid droplets of the imprint material supplied onto the substrate spread as in the related art, an optical system having a high optical performance is required for a scope (detection system). Therefore, an increase in cost of the imprint apparatus results with the configuration of the related art. However, the detecting unit 10 of the first embodiment needs only to have an optical system that detects the interference fringe, and high cost optical systems having high optical performances are not required.

Figure 2:
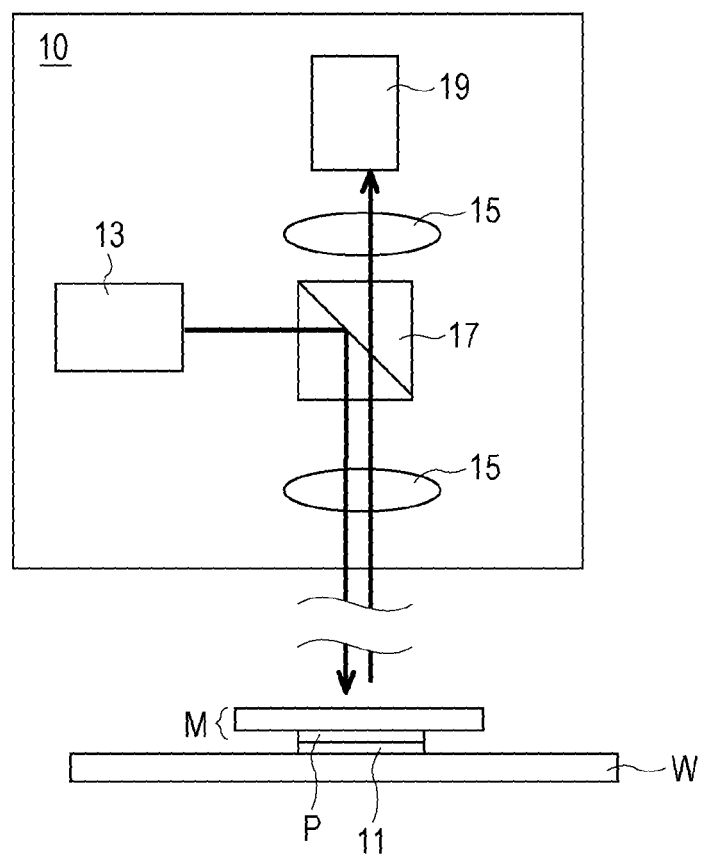
FIG. 2 is a drawing illustrating a detecting unit of the first embodiment.

FIG. 2 illustrates the detecting unit 10 of the first embodiment. Illuminating light from the detecting unit 10 and detection light detected by the detecting unit 10 pass through the mirror 9, the mold stage 4, and the mold chuck 3 in FIG. 1, respectively. However, the mold chuck 3, the mold stage 4 and the mirror 9 are omitted in FIG. 2. The detecting unit 10 is a scope capable of observing the contact state between the mold M (or the pattern P) and the imprint material 11. The detecting unit 10 is designed to observe entire or part of the shot area to which the pattern P of the mold M is transferred. The detecting unit 10 is provided with a light source 13 configured to irradiate the mold M and the substrate W with visible light. The visible light from the light source 13 is reflected by an optical element 17 (beam splitter), passes through a lens 15, and illuminates the substrate W as illuminating light. The illuminating light reflected by the substrate W passes through the lens 15 and the optical element 17 as detection light, and is detected by an image pickup element 19 (imaging unit). On the basis of an image formed on the image pickup element 19 by the detection light, the contact state with the mold M on the substrate W and may be observed.

A light receiving surface of the image pickup element 19 is an optically conjugated surface with respect to surfaces of the pattern P of the mold M and the substrate W in contact with the imprint material 11, and the lens 15 is configured to form an image of the surfaces of the pattern P of the mold M and the substrate W on the light receiving surface.

The illuminating light from the light source 13 has been described to be visual light. However, the illuminating light is not limited to the visible light. In the first embodiment, the detecting unit 10 detects an interference fringe in order to observe the contact state between (the surface of the pattern P of) the mold M and the imprint material 11 as described later. Therefore, the interference fringe can be detected more easily by using light having a narrow wavelength range (monochromatic light) as illuminating light to be radiated from the light source 13. However, when the detection light is fixed to have a narrow wavelength range, visibility of the detection light may be impaired due to interference conditions with the mold M or the substrate W. Therefore, the wavelength is preferably remained to be variable. If interference fringes that can be detected by the image pickup element 19 can be generated with light having a wide wavelength range (light having a large bandwidth), light having a wide wavelength range may be used.

For example, the wavelength of light to be radiated from the light source 13 may be determined by arranging a plurality of LEDs configured to radiate light having different wavelengths, and selecting an LED that radiates light having a wavelength which makes the interference fringe visible optimally. Light from lamp light configured to radiate light having a wide wavelength range may be extracted. Light having a wavelength range optimal to detect the interference fringe may be generated by providing a plurality of wavelength cut filters having different band frequencies and switching among the wavelength cut filters as needed.

Figure 3:
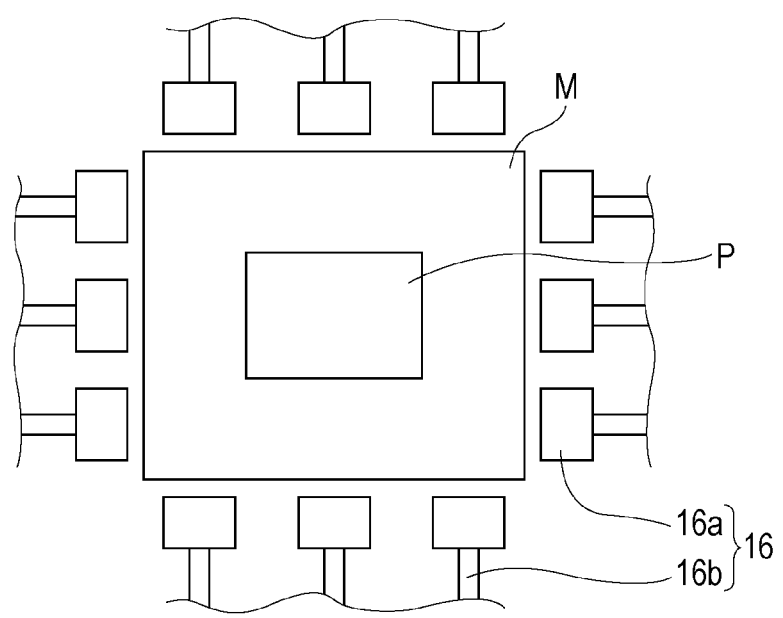
FIG. 3 is a drawing illustrating a correcting mechanism of a mold of the first embodiment.

FIG. 3 illustrates correcting mechanisms 16 (deforming unit) configured to correct (deforming member) the shape of the mold M. The correcting mechanisms 16 are configured to apply a force from a direction parallel to the surface of the pattern of the mold M to deform the pattern P (surface of the pattern P). For example, each of the correcting mechanisms 16 includes a contact portion 16a configured to come into contact with a side surface of the mold M, and an actuator 16b configured to drive the contact portion 16a in a direction toward the side surface of the mold M or away from the side surface of the mold M as illustrated in FIG. 3. The correcting mechanisms 16 may each have a heating device configured to provide the mold M or the substrate W with heat, and the pattern P may be deformed by controlling the temperature of the mold M by the correcting mechanisms 16 each including the heating device. Alternatively, the shot area of the substrate W may be deformed by controlling the temperature of the substrate W. The contact portions 16a may be sucking mechanisms which suck the side surface of the mold M.

Figure 4:
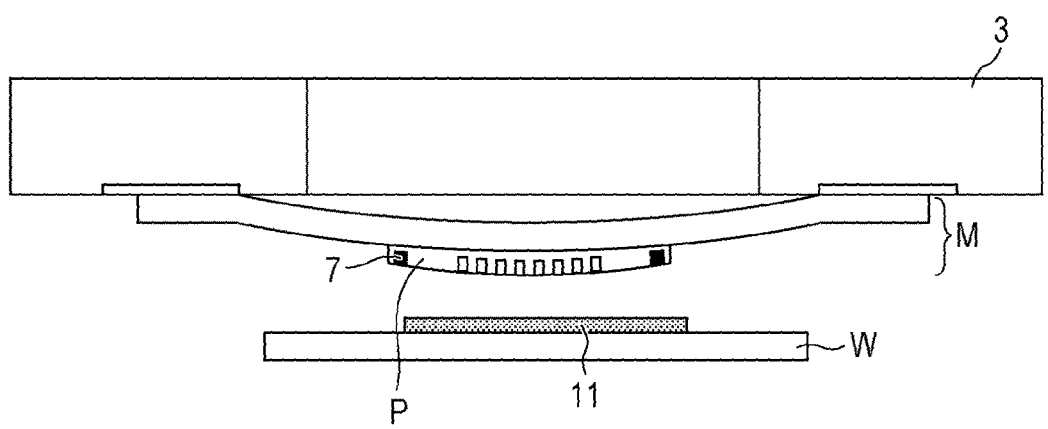
FIG. 4 is a cross-sectional view illustrating a state of bringing the mold and an imprint material into contact with each other.

FIG. 4 illustrates a state in which the mold M (surface of the pattern) is curved to project toward the substrate W. As a method of curving the mold M (surface of the pattern), a method of applying pressure from the mold chuck 3 that holds the mold M to the mold M is exemplified. A space between the mold M and the mold chuck 3 is a closed space, and the mold chuck 3 is provided with a mechanism configured to vary the pressure (air pressure) in the space. The imprint apparatus of the first embodiment brings part of the pattern P into contact with the imprint material 11 on the substrate in a state in which the mold M is curved as illustrated in FIG. 4. After part of the pattern P has been brought into contact with the imprint material 11, the imprint material 11 is brought into contact with an entire surface of the pattern P so as to increase the contact surface area between the pattern P and the imprint material 11 while straightening the mold M curved into a convex shape (canceling the curvature). By bringing the mold M into contact with the imprint material 11 in the curved state, air bubbles can hardly be remained in a concave of the pattern P.

Figure 5A:
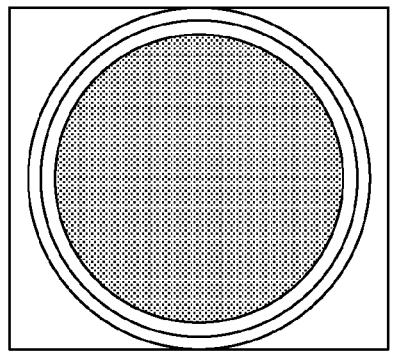
FIGS. 5A to 5F are drawings illustrating a contact area between the mold and the imprint material and an interference fringe in the periphery thereof.
Figure 5C:
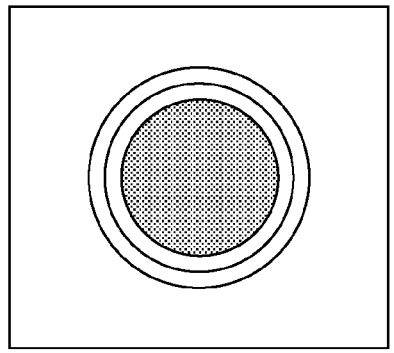
Figure 5E:
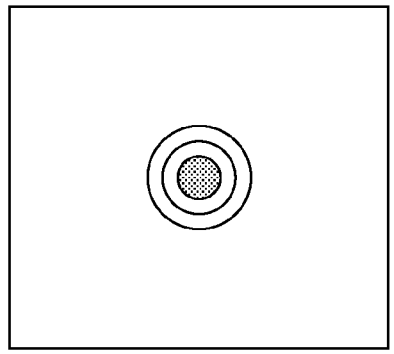
Figure 5B:
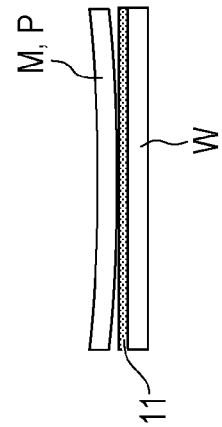
Figure 5D:
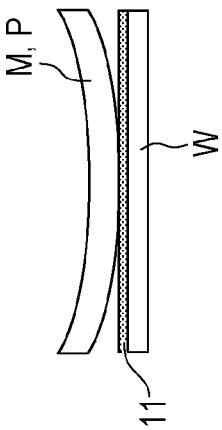
Figure 5F:
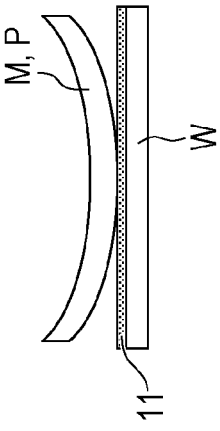

FIGS. 5A to 5F are drawings illustrating the contact state in which the mold M is brought into contact with the imprint material 11 in the curved state. FIGS. 5A to 5F illustrate a state in which no foreign substance (particle) is present between the mold M and the substrate W. FIGS. 5A, 5C, and 5E illustrate observed images detected by the image pickup element 19 of the detecting unit 10 when bringing the pattern P into contact with the imprint material 11, respectively. FIGS. 5B, 5D, and 5F illustrate cross sections of the pattern P and the substrate W, respectively.

FIG. 5A illustrates a state in which the mold M is curved (deformed), and the pattern P is brought into a first contact with the imprint material 11. The highest point of the pattern P in the convex shape is in contact with the imprint material 11. At this time, the observed image observed by the detecting unit 10 includes an area where the pattern P and the imprint material 11 are in contact with each other (solid area at a center), and an interference fringe caused by interference of light in the periphery thereof. FIG. 5B illustrates a cross section of the pattern P and the substrate W at this time.

By straightening the mold M gradually into a flat surface after the pattern P and the imprint material 11 have come into contact with each other, a contact surface area between the pattern P and the imprint material 11 is increased. FIGS. 5C and 5E illustrate a state in which the contact surface area between the pattern P and the imprint material 11 is increased. A state in which the contact surface area between the pattern P and the imprint material 11 is uniformly (concentrically) increased from the center of the pattern portion toward the peripheral portion is illustrated.

FIGS. 5D and 5F illustrate cross sections of the pattern P and the substrate W corresponding to FIGS. 5C and 5E, respectively. It is understood that the contact surface area between the pattern P and the imprint material 11 is increased as the curvature of the mold M (pattern P) is gradually straightened. The interference fringe seen in the periphery of the area where the pattern P and the imprint material 11 are in contact with each other is also spread corresponding to the increase of the contact surface area. The interference fringe is generated by interference between light reflected from the surface of the pattern P and light reflected from the surface of the substrate W. Finally, the pattern P and the imprint material 11 come into contact with each other over the entire surface of the imprint area (shot area), the interference fringe is not seen any longer. When the pattern P and the imprint material 11 come into contact with each other, since the there is little difference in refractive index between the pattern P and the imprint material 11, light is not reflected by the surface of the pattern P, and hence the interference fringe cannot be seen any longer.

Figure 6:
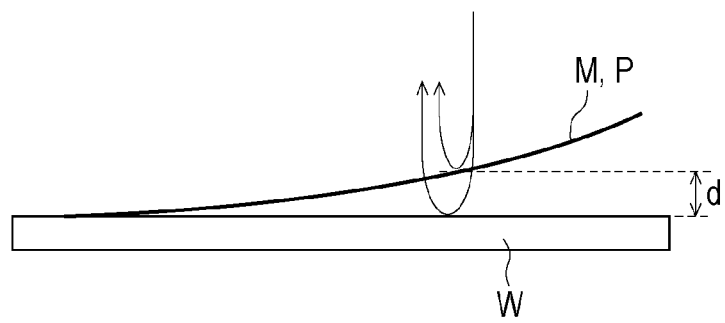
FIG. 6 is an explanatory drawing illustrating a phenomenon in which the interference fringe is seen in the periphery of the contact area.

A phenomenon in which the interference fringe due to the interference of light is seen in the periphery of the contact area will be described with reference to FIG. 6. When the mold M is curved with respect to the substrate W and brought into contact with (stamped on) the imprint material 11, illuminating light radiated from the detecting unit 10 onto the mold M and the substrate W is reflect by the surface of the substrate W, and is reflected by the surface opposing the substrate W of the mold M (pattern P). The interference fringe is generated by interference between the reflected light from the substrate W and the reflected light from the mold M. The distances at respective positions in a range from the centers of the substrate and the mold M toward the peripheries thereof is represented by d, a wavelength of the detection light used in the detecting unit 10 is represented by λ, and a refractive index of medium between the substrate W and the mold M is represented by n, the conditions of generation of the interference fringe is expressed by $$\begin{cases} 2nd = \left(m + \dfrac{1}{2}\right)\lambda: & \text{BRIGHT LINE } (m = 0, 1, 2\Lambda) \\ 2nd = m\lambda: & \text{DARK LINE} \end{cases} \quad \text{Expression 1}$$

In a portion in which the mold M and the imprint material 11 are in contact with each other, the imprint material is present between the mold M and the substrate W. As described above, since there is little difference in refractive index between the pattern P and the imprint material 11, light is not reflected by the surface of the pattern P. Therefore, the interference fringe is not generated in the area in which the mold M and the imprint material 11 are in contact with each other. A bright and dark ring pattern similar to a Newton's ring, in which several bright and dark rings are repeated in a concentric fashion, appears in the periphery of the contact portion between the mold M and the imprint material 11. The contact state between the substrate W and the mold M is observed by using the interference fringe.

The difference in contact state will be described with reference to FIGS. 7A to 7D. The respective drawings in FIGS. 7A to 7D illustrate images of contact areas picked up by the detecting unit 10 and interference fringes in the peripheries thereof, and illustrate cases where the contact states are different from the contact states illustrated in FIGS. 5A to 5F (ideal contact state) due to any event.

Figure 7A:
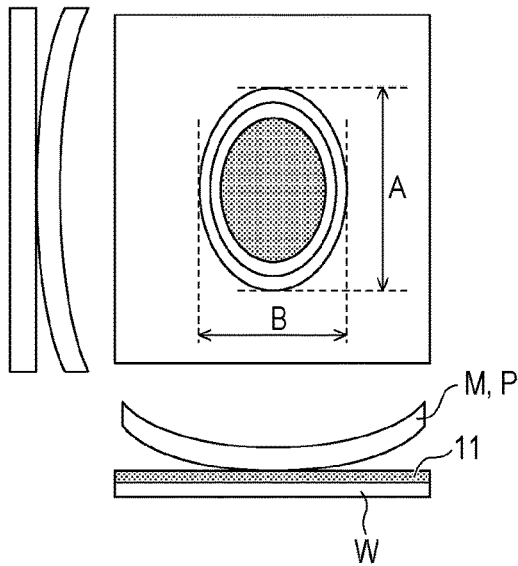
FIGS. 7A to 7D are drawings illustrating a contact state among the detected interference fringe, the mold, and the substrate of the first embodiment.

FIG. 7A illustrates a contact area observed when the mold M and the imprint material 11 are brought into contact with each other, and a case where the interference fringe in the periphery thereof is formed into an ellipse. This shows a case where the curvature of the curved mold M is different between the vertical direction and the lateral direction. If the correction amount of the mold M by the correcting mechanisms 16 described in conjunction with FIG. 3 is significantly different between the vertical direction and the lateral direction, the curvature of the curve of the mold M in the vertical direction may be different between the vertical direction and the lateral direction. As illustrated in FIGS. 5A, 5C, and 5E, the contact area and the interference fringe in the periphery thereof are preferably close to a circle. Since the mold M and the imprint material 11 may be brought into contact with each other without difference depending on the direction by pressing the mold M with the same curvature in the vertical direction and the lateral direction, the concave of the pattern may easily be filled with a resin.

Accordingly, when the mold M and the imprint material come into contact with each other, lengths of a long side A and a short side B are obtained from the image of the elliptical interference fringe picked up by the detecting unit 10. Accordingly, the elliptical shape may be detected. For example, the ellipticity may be obtained from the ratio of the short side B with respect to the long side A as the expression given below. A flattening and an eccentricity may be obtained from the values of the long side and the short side.

$$\text{ELLIPTICITY} = \frac{B}{A} \qquad \text{Expression 2}$$

$$\text{FLATTENING} = 1 - \frac{B}{A} \qquad \text{Expression 3}$$

$$\text{ECCENTRICITY} = \sqrt{1 - \frac{B^2}{A^2}} \qquad \text{Expression 4}$$

A relationship between the amount of deformation (amount of curvature) of the mold M and the elliptical shape is obtained in advance, and is compared with the elliptical shape detected by the detecting unit 10, whereby the amount of deformation of the mold M may be obtained. The correction amount of the correcting mechanisms 16 is optimized on the basis of the obtained amount of deformation, adjustment of the amount of deformation is achieved. The contact state is corrected by adjusting the amount of deformation of the mold M. In order to curve the mold M so as to project toward the substrate W, the pressure of gas present in the space on the side opposite to the surface where the pattern P of the mold M is formed is increased for adjustment. It is because if the difference in force applied by the correcting mechanisms 16 is significant between the lateral direction and the vertical direction, there arises a difference in amount of deformation of the mold M. Therefore, the difference in amount of deformation of the mold M is adjusted by adjusting the forces of the correcting mechanisms 16 from two directions. However, if the correcting mechanisms 16 are adjusted, precision in superposition (pattern transfer precision) may be affected. Therefore, one of the correction amount of the pattern P by the correcting mechanisms 16 and the amount of curvature at the time of contact between the pattern P and the imprint material, which has a larger influence on pattern transfer, may be adjusted according to the ellipticity of the interference fringe or the like.

Figure 7B:
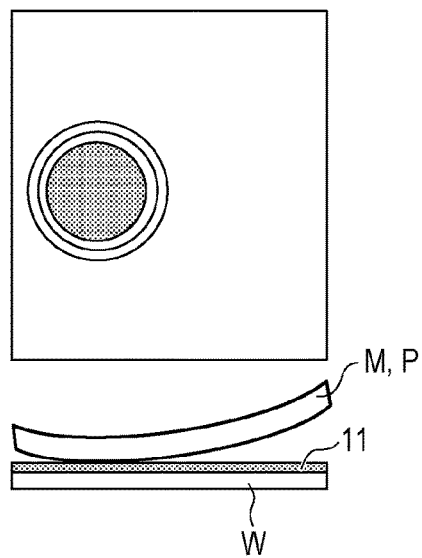

FIG. 7B illustrates an example in which the center of the contact area and the interference fringe generated in the periphery thereof observed when the mold M and the imprint material 11 come into contact with each other is deviated from the center of the pattern P (shot area). The reason may be that the pattern P of the mold M and the shot area on the substrate W are deviated, or the mold M is in contact with the imprint material 11 in an inclined manner. In the case where the pattern P and the shot area on the substrate W are deviated, the contact state may be corrected by measuring the alignment marks on the mold M and the substrate W again and performing alignment again. In the case where the mold M is inclined even after the alignment and the center of the interference fringe is deviated, the direction and the amount of the relative inclination between the mold M and the substrate W are detected on the basis of the direction and the amount of positional deviation of the center of the interference fringe. The inclination of the mold M or the substrate W is adjusted so that the center of the interference fringe is aligned with the center of the pattern P (or the shot area on the substrate W).

The detecting unit 10 is configured to pick up the images of a scribe line surrounding the shot area or an end of the area where the pattern P of the mold M is formed simultaneously with the contact area and the interference fringe in the periphery thereof. The shot area may be obtained from the scribe line the image of which is picked up or the end of the area where the pattern P of the mold M is formed. As a method of specifying a contact position with respect to the shot area, pattern matching with the concentric pattern indicating the contact area is performed on the basis of the result of image picked up by the detecting unit 10, so that the center of the contact area (contact position) may be obtained from the center of the shot area.

The relationship between the amount of inclination and the amount of positional deviation of the center of the interference fringe may be obtained by calculation or experiment in advance, so that the correction may be performed on the basis of the relationship. The mold chuck 3 configured to hold the mold M is provided with an inclination adjusting mechanism configured to adjust the inclination of the mold M, so that the inclination may be corrected from the relationship between the amount of the positional deviation of the center obtained from the result of image picked up by the detecting unit and the amount of inclination obtained in advance and the amount of positional deviation of the center of the interference fringe.

Figure 7C:
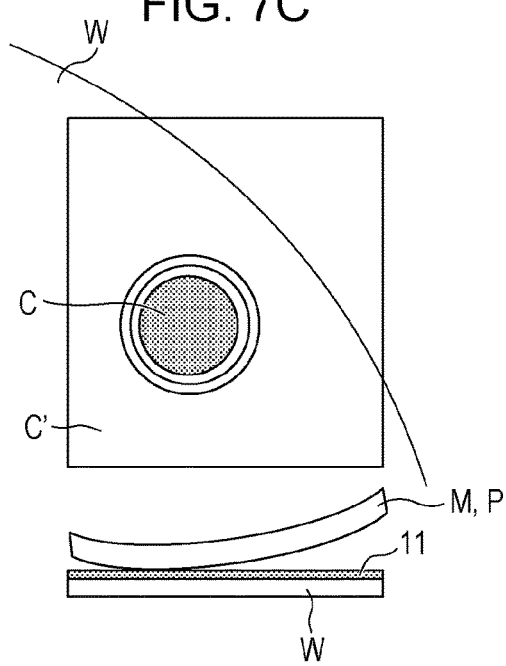

When the pattern is transferred to the peripheral portion (shot area including an edge) of the substrate as illustrated in FIG. 7C, a pattern partly lacking is transferred to the substrate. In this case, there is a case where the mold M is inclined on purpose in order to cause the mold M and the imprint material 11 to come into contact with each other from a specific position such as the center or a position of center of gravity of the shot area (position C in FIG. 7C) or a portion near the center of the substrate (position C' in FIG. 7C). Whether the mold M and the imprint material 11 are brought into contact with each other firstly at the specific position may be checked from the position where the interference fringe is generated. In this manner, the detection unit 10 detects the position of the center of the interference fringe generated in the contact area and in the periphery thereof (the position of the interference fringe), whereby correction of the contact position as the contact state is enabled.

Figure 7D:
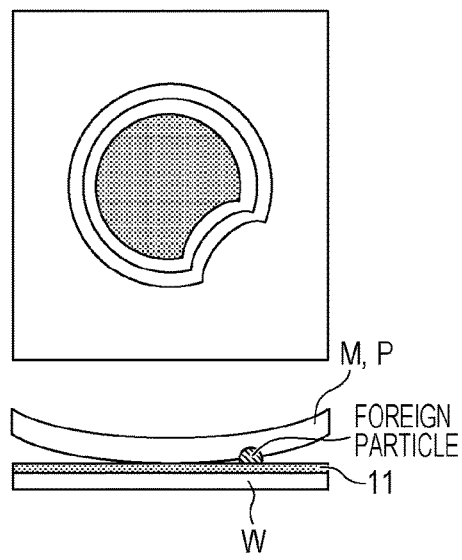

In FIG. 7D, the contact area and the interference fringe generated in the periphery thereof observed when the mold M and the imprint material 11 are brought into contact with each other has a shape losing touch with the circular shape (deformed shape). This may be because an air bubble or a foreign substance (particle) is present between the mold M and the substrate W. Normally, the distance d (FIG. 6) between the substrate W and the mold M is determined continuously by the inclination (amount of deformation) of the mold M. Therefore, the contact area and the interference fringe in the periphery thereof spread from the center of the shot area to the peripheral portions in a concentric fashion as illustrated in FIGS. 5A to 5F. However, the interference fringe cannot have a concentric circular shape due to an air bubble or a foreign substance present between the mold M and the substrate W.

As a method of detecting an interference fringe deformed from the concentric circular shape includes a method of obtaining an inclination of a tangent line on a boundary from the contact area or the image of the interference fringe detected by the detecting unit 10 when bringing the mold M and the imprint material 11 into contact with each other. In the normal state illustrated in FIGS. 5A to 5F, the circular shape indicating the contact area or the inclination of the tangent line of the shape of the interference fringe do not change. When the contact area or part of the interference fringe is deformed from the concentric circular shape as illustrated in FIG. 7D, the obtained inclination of tangent line changes correspondingly. Part subjected to the change may be recognized as the deformation of the interference fringe. It is also possible to obtain the change of the interference fringe at the time of normal pattern transfer as illustrated in FIGS. 5A to 5F in advance and compare the changes at every pattern transfer. Since deformation of the interference fringe from the concentric circular shape is sensed, calculation of the difference from the interference fringe obtained at a normal shot is conceivable. By the comparison with the pattern at every pattern transfer, the contact state, that is, a time period required for the imprint material to spread over the area in which the pattern is formed from the first contact (spreading time) may be obtained. The size of the contact area after a predetermined time period has elapsed from the start of contact at the normal pattern transfer illustrated in FIGS. 5A to 5F may be obtained in advance. Therefore, the result of image picked up by the detecting unit when a predetermined period has elapsed after the first contact and the pattern obtained in advance are compared, and whether the time required for the contact area to spread is short or long may be obtained from the difference in size in comparison with that at the time of normal pattern transfer. If the air bubble remains between the mold and the substrate, defective transfer pattern results. Therefore, the corresponding shot becomes a defective shot. Since the probability of the defective shot may be pointed out in advance, the corresponding shot area may be intensively inspected at a defect inspection after an imprint process. If the foreign substance is present therebetween, the mold M may become damaged, for example, the pattern P may be broken by the foreign substance attached to the mold M. If the pattern is transferred to another shot area with the foreign substance attached to the mold M, defective transfer patterns may occur repeatedly.

Therefore, when the contact area and the interference fringe in the periphery thereof detected by the detecting unit 10 are deformed from the concentric circular shape as illustrated in FIG. 7D, the imprint process is preferably stopped immediately in order to avoid damage on the mold M or the substrate W. However, since a process from the contact between the pattern P and the imprint material 11 until the filling of the entire surface of the pattern P with the imprint material 11 is performed in a very short time, there may be a case where the imprint process cannot be stopped.

Therefore, when the imprint process cannot be stopped in the course of contact, the foreign substance needs to be removed by replacing the mold M and cleaning after the pattern transfer. Since there is a probability that the pattern P of the mold M is broken, inspection of the pattern P is also required. By detecting the contact state by the detecting unit 10, necessity of cleaning of the mold M or inspection of the pattern P as above described may be found.

Depending on the case, since the mold M or the substrate W may be curved locally by the presence of the foreign substance, and the interference fringe may be generated around the foreign substance, the foreign substance may be detected by using this phenomenon. Furthermore, the state of imprint material supplied (applied) onto the substrate may be detected by observing how the interference fringe spreads. When the amount of supply of the imprint material is large, the distance between the mold M and the substrate W is increased, and when the amount of supply of the imprint material is small, the distance between the mold M and the substrate W is small. The interference fringe generated differs depending on the distance between the mold M and the substrate W. Therefore, by observing the difference in the interference fringes, the cases where the amount of the imprint material 11 supplied onto the substrate W is large or small may be detected to adjust the amount of supply or the position of supply (distribution) of the imprint material 11.

From the operation described above, the contact state between the mold M and the substrate W can be detected by detecting the interference fringe that may be generated in association with the contact between the pattern P and the imprint material 11. Examples of the contact state that may be detected include the amount of curvature of the mold M, the relative portion between the mold M and the substrate W, the contact position therebetween, presence or absence of foreign substances, the amount of supply of the imprint material, and the position of supply.

Second Embodiment

As a detecting method when a foreign substance is present between the mold M and the substrate W, another embodiment will be described. In a second embodiment, a case where polarization light is used as illuminating light for observing the contact state will be described.

Figure 8:
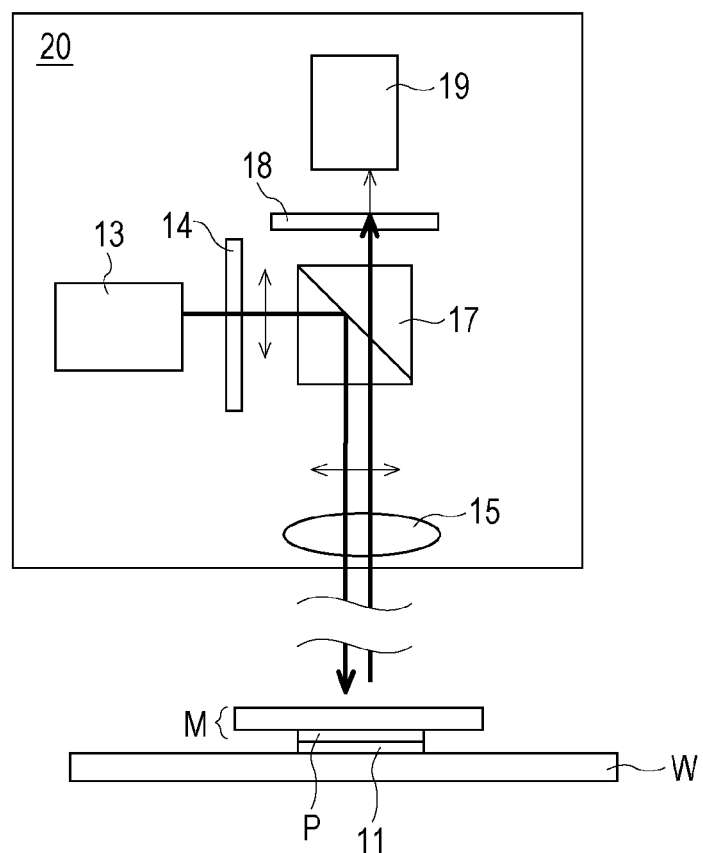
FIG. 8 is a drawing illustrating a detecting unit of a second embodiment.

The second embodiment will be descried with reference to FIG. 8. FIG. 8 illustrates a detecting unit 20 and a cross section of the mold M and the substrate W. Light (illuminating light) from the light source 13 is reflected by the optical element 17 (half mirror) and passes through the lens 15 to illuminate the mold M and the pattern P of the substrate W. At this time, light (transmitted light) from the light source 13 passes through a polarization element 14, whereby only light having a polarization direction parallel to a paper plane can be passed therethrough. Light (detection light) reflected from the mold M or the substrate W passes through the lens 15, passes through the optical element 17, and is detected by the image pickup element 19.

In the second embodiment, the image pickup element 19 detects only part of the detection light passing through the optical element 17 which passes through a polarization element 18. The polarization element 18 is arranged so as to polarize light in a direction orthogonal to the polarization direction of light passing through the polarization element 14. If the polarization direction of light passing through the polarization element 14 has no change, the detection light does not pass through the polarization element 18, and hence is not detected by the image pickup element 19.

If a foreign substance is present between the substrate W and the mold M, a stress birefringence may occur depending on the strain of the mold M. By the generation of the birefringence of the mold M, polarization light that passes through the mold is scattered (the polarization direction is changed). Therefore, the strain of the mold M may be detected by using polarization light as the illuminating light.

If no foreign substance is present between the substrate W and the mold M, and no strain is generated on the mold M, the polarization direction of light after having passed through the polarization element 14 does not change. Since the polarization element 18 is orthogonal to the polarization of the detection light, the detection light does not pass through the polarization element 18, and does not enter the image pickup element 19.

However, if a foreign substance is present between the substrate W and the mold M, the mold M is strained, and a stress birefringence occurs, so that the polarization direction of light passing through the polarization element 14 changes. Since the light having the polarization direction changed by birefringence passes through the polarization element 18, the detection light from the mold M may be observed by the image pickup element 19. The contact state between the mold M and the substrate W may be detected by using the polarization light, and whether there is a foreign substance present between the mold M and the substrate W may be detected.

The optical element 17 and the polarization element 18 may be integrally formed. By arranging a so-called polarizing beam splitter as the optical element 17, the function of the polarization element 18 may be provided, and the relationship of reflection and penetration on the basis of the above-described polarization direction may be established.

Third Embodiment

Figure 9A:
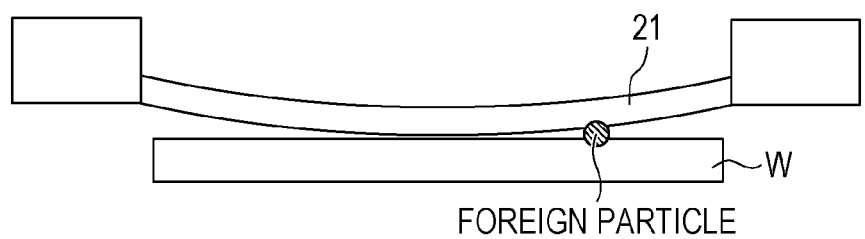
FIGS. 9A and 9B are a cross-sectional view of the mold and the flat plate, and a drawing illustrating a contact state of a third embodiment.
Figure 9B:
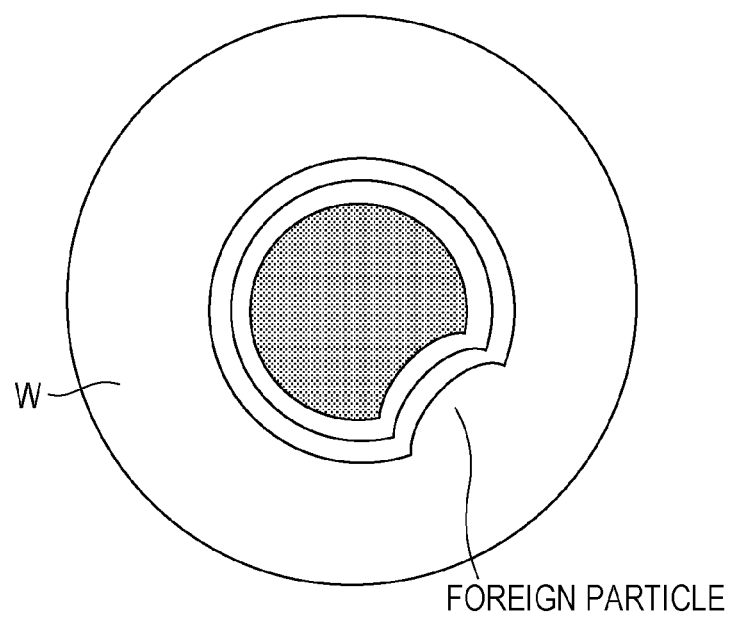

A method of detecting a foreign substance attached on the substrate W will be described with reference to FIGS. 9A and 9B. A foreign substance attached on the substrate W is detected by pressing a flat plate 21 (inspection board) having no pattern formed thereon against the substrate W before the imprint process in a third embodiment.

In the imprint process, if the foreign substance is present between the mold M and the substrate W, the braking of a pattern formed on the mold M or contamination of the mold M may occur. Therefore, it is preferable that no foreign substance is present on the substrate W at the time of imprint process. Therefore, as illustrated in FIG. 9A, the flat plate 21 having no pattern formed thereon is pressed against the substrate W before the imprint process. At this time, in the same manner as the first embodiment and the second embodiment, the flat plate 21 is brought into contact with the substrate W in a curved shape and the curved flat plate 21 is brought into contact with the substrate W so as to increase the contact surface area between the flat plate 21 and the substrate W while making the flat plate 21 restored to the flat shape (canceling the curve). The flat plate 21 needs to be free from the foreign substance on the surface coming into contact with the substrate so that cleaning is performed before bringing into contact with the substrate W.

In this manner, whether a foreign substance is present or not on the substrate is detected by bringing the flat plate 21 into contact with the substrate W and detecting the interference fringe may be detected. FIG. 9B illustrates a state of the interference fringe detected by the detecting unit 10 when a foreign substance is attached on the substrate W. Since the foreign substance is attached between the flat plate 21 and the substrate W, the contact area does not spread in a concentric fashion. The interference fringe in the periphery of the contact area is also deformed from the concentric circle shape.

Suppose that there is a foreign substance present on the substrate W, since no pattern is formed on the flat plate 21 (inspection board), the flat plate 21 may be changed easily. When the substrate W may be damaged by direct contact between the flat plate 21 and the substrate W, the flat plate 21 may be brought into contact with the substrate W after having supplied suitable liquid onto the substrate W.

As described in the third embodiment, attachment of a foreign substance on the substrate W may be detected before the imprint process by detecting the contact area between the flat plate 21 and the substrate W or the interference fringe in the periphery thereof by using the flat plate 21.

In any of the embodiments described above, when the presence of a foreign substance attached on the substrate W is found, a process of removing the foreign substance on the substrate W may be performed, or the position of the foreign substance on the substrate W may be memorized. If the removal of the foreign substance on the substrate is failed, the imprint process is performed so as not to bring the pattern P of the mold M into contact with an area of the substrate W where the foreign substance is attached.

In any of the embodiments described above, a photo-curing method, which is an imprint method in which the imprint material (photo-curing resin) is cured by radiating light (UV-light) has been described. However, this disclosure is not limited to the imprint method on the basis of the photo-curing method. Examples of known imprint method include a heat cycle method in addition to the photo-curing method. In the heat-cycle method, a thermoplastic resin is heated to a temperature not lower than a glass-transition temperature, the mold is pressed against the substrate by the intermediary of the resin in a state in which fluidity of the resin is increased, and the mold is separated from the resin after having cooled, whereby a pattern is formed. In this disclosure, the imprint method using a heat cycle method is also applicable as long as the contact area where the imprint material supplied to the substrate and the mold are in contact with each other or the interference fringe generated in the periphery thereof may be detected by the detecting unit 10 during the imprint process.

Method of Manufacturing Device

A method of manufacturing a device (semiconductor integrated circuit device, liquid crystal display device, and the like) as an article includes a process of forming a pattern on a substrate (wafer, glass plate, and film wafer) by using the imprint apparatus described above. In addition, the manufacturing method described above may include a process of etching the substrate on which a pattern is formed. In a case of manufacturing other articles such as patterned media (recording media) or optical devices, the manufacturing method may include other processes which machine the substrate on which the pattern is formed instead of etching. The method of manufacturing an article of the embodiment is advantageous in terms of at least one of performance, quality, productivity, and production cost or articles in comparison with the method of the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of detecting a foreign substance between a plate and a substrate on which an uncured material is provide the method comprising:
    bringing the plate into contact with the uncured material on the substrate so that a contact surface area of the plate contacting the uncured material increases;
    detecting an interference fringe generated around the contact surface area by reflected light from the plate and reflected light from the substrate; and
    detecting the foreign substance existing between the plate and the substrate based on a deformation of a shape of the interference fringe,
    wherein, in a case where the foreign substance is detected as existing between the plate and the substrate, bringing further includes stopping the increasing of the contact surface area of the plate contacting the uncured material or detecting further includes obtaining a position of the foreign substance on the substrate.

2. The method according to claim 1, wherein the plate is a flat plate having no pattern in the contact surface area.

3. The method according to claim 1, wherein the plate is a mold having a pattern in the contact surface area.

4. The method according to claim 1, wherein detecting the foreign substance includes comparing a standard with the detected interference fringe.

5. The method according to claim 1, further comprising stopping an action to bring the plate into contact with the uncured material on the substrate in a case where it is determined that foreign substance is present on the substrate.

6. The method according to claim 1, further comprising memorizing a position of the foreign substance on the substrate in a case where it is determined that foreign substance is present on the substrate.

7. The method according to claim 1, wherein, in a case where it is determined that the increase of the contact surface area cannot be stopped immediately, bringing includes allowing the increase of the contact surface area of the plate contacting the uncured material to continue after determining that the increase of the contact surface area cannot be stopped immediately.

8. The method according to claim 1, further comprising removing the foreign substance from between the plate and the substrate in a case where the foreign substance is detected as existing between the plate and the substrate.

9. The method according to claim 1, further comprising imaging a shot area attached with the foreign substance based on information from detecting the foreign substance as existing between the plate and the substrate.

10. A method of detecting a deformation by bringing a plate into contact with an uncured material on a substrate, the method comprising:
    bringing the plate into the contact with the uncured material on the substrate so that a contact surface area of the plate contacting the uncured material increases;
    detecting an interference fringe generated around the contact surface area by reflected light from the plate and reflected light from the substrate; and
    detecting the deformation of the plate around the contact surface area between the plate and the substrate based on the detected interference fringe, wherein the interference fringe varies according to a space between the plate and the substrate,
    wherein, in a case where the deformation of the plate is detected, bringing further includes stopping the increasing of the contact surface area of the plate contacting the uncured material or detecting further includes memorizing the deformation of the plate.

11. The method according to claim 10, wherein the plate is a flat plate having no pattern in the contact surface area.

12. The method according to claim 10, wherein the plate is a mold having a pattern in the contact surface area.

13. The method according to claim 10, wherein detecting the deformation of the plate includes comparing a standard interference fringe with the detected interference fringe.

14. A method of detecting a foreign substance on a substrate by bringing a mold and an imprint material on the substrate into contact with each other, the method comprising:
    bringing the mold into contact with the imprint material on the substrate so that a contact surface area of the mold contacting the imprint material increases;
    detecting an interference fringe generated around the contact surface area by reflected light from the mold and reflected light from the substrate; and
    detecting the foreign substance existing beween the mold and the substrate based on a deformation of a shape of the interference fringe,
    wherein, in a case where the foreign substance is detected as existing between the plate an the substrate, bringing further includes stopping the increasing of the contact surface area of the plate contacting the uncured material or detecting further includes obtaining a position of the foreign substance on the substrate.

15. The method according to claim 14, wherein the mold has a pattern to form a pattern of the imprint material.

16. The method according to claim 14, wherein detecting the foreign substance includes comparing a standard interference fringe with the detected interference fringe.

17. The method according the claim 14, further comprising stopping an action to bring the mold into contact with the imprint material on the substrate in a case where it is determined that foreign substance is present on the substrate.

18. The method according to claim 14, further comprising memorizing a position of the foreign substance on the substrate in a case where it is determined that foreign substance is present on the substrate.

19. A method of detecting a deformation by bringing a mold into contact with an imprint material on a substrate, the method comprising:
    bringing the mold into contact with the imprint material on the substrate so that a contact surface area of the mold contacting the imprint material increases;
    detecting an interference fringe generated around the contact surface area by reflected light from the mold and reflected light from the substrate; and
    detecting the deformation of the mold around the contact surface between the mold and the substrate based on the detected interference fringe, wherein the interference fringe varies according to a space between the mold and the substrate,
    wherein, in a case where the deformation of the plate is detected, bringing further include stopping the increasing of the contact surface area of the plate contacting the uncured material or detecting further includes obtaining a position of the foreign substance on the substrate.

20. The method according to claim 19, wherein the mold has a pattern to form a pattern of the imprint material.

21. The method according to claim 19, wherein detecting the deformation of the mold includes comparing a standard interference fringe with the detected interference fringe.

22. A method of manufacturing an article, the method comprising: detecting a foreign substance on a substrate using a method of detecting the foreign substance; and
    processing the substrate, on which the foreign substrate has been detected, to manufacture the article,
    wherein the method of detecting is a method of detecting the foreign substance between a plate and a substrate on which an uncure material is provided, and includes:
    bringing the plate into contact with the uncured material on the substrate so that a contact surface area of the plate contacting the uncured material increases,
    detecting an interference fringe generated around the contact surface area by reflected light from the plate and refelcted light from the substrate, and
    detecting the foreign substance existing the plate and the substrate based on a deformation of a shape of the interference fringe,
    wherein, in a case where the foreign substance is detected as existing between the plate and the substrate, processing includes processing the substrate using the detecting of the foreign substance as existing between the plate and the substrate.

23. The method according to claim 22, wherein, in the case where the foreign substance is detected as existing between the plate and the substrate, processing includes stopping the processing of the substrate on which the foreign substrate has been detected.

24. The method according to claim 22, wherein using the detecting of the foreign substance includes stopping the increasing of the contact surface area of the plate contacting the uncured material.

25. A method of manufacturing an article, the method comprising: detecting a deformation by using a method of detecting the deformation that includes
    bringing a plate into contact with an uncured material on a substrate; and
    processing the substrate, using the plate having the detected deformation, to manufacture the article,
    wherein the method of detecting includes:
    bringing the plate into contact with the uncured material on the substrate so that a contact surface area of the plate contacting the uncured material increases,
    detecting an interference fringe generated around the contact surface area by reflected light from the plate and reflected light from the substrate, and
    detecting the deformation of the plate around the contact surface area between the plate and the substrate based on the detected interference fringe,
    wherein, in a case where the deformation of the plate is detected, processing includes processing the substrate using the detecting of the deformation of the plate.

26. A method of manufacturing an article, the method comprising
    detecting a foreign substance on a substrate, using a method of detecting the foreign substance; and
    processing the substrate, on which the foreign substrate has been detected, to manufacture the article,
    wherein the method of detecting is a method of detecting the foreign substance on the substrate by bringing a mold and an imprint material on the substrate into contact with each other and includes:
    bringing the mold into contact with the imprint material on the substrate so that a contact surface area of the mold contacting the imprint material increases,
    detecting an interference fringe generated around the contact surface area by reflected light from the mold and reflected light from the substrate, and
    detecting the foreign substance existing between the mold and the substrate based on a deformation of a shape of the interference fringe,
    wherein, in a case where the foreign substance is detected as existing between the plate and the substrate, processing includes processing the substrate using the detecting of the foreign substance as existing between the plate and the substrate.

27. A method of manufacturing an article, the method comprising:
    detecting a deformation by using a method of detecting the deformation that includes bringing a mold into contact with an imprint material on a substrate; and
    processing the substrate, using the mold having the detected deformation, to manufacture the article,
    wherein the method of detecting includes:
    bringing the mold into contact with the imprint material on the substrate so that a contact surface area of the mold contacting the imprint material increases,
    detecting an interference fringe generated around the contact surface area by reflected light from the mold and reflected light from the substrate, and
    detecting the deformation of the mold around the contact surface area between the mold and substrate based on the detected inteference fringe,
    wherein, in a case where the deformation of the plate is detected, processing includes processing the substrate using the detecting of the deformation of the plate.

* * * * *